United States Patent
Usami et al.

[11] Patent Number: 6,162,701
[45] Date of Patent: *Dec. 19, 2000

[54] SEMICONDUCTOR DEVICE AND METHOD FOR MAKING SAME

[75] Inventors: Mitsuo Usami, Akishima; kunihiro Tsubosaki, Hino; Kunihiko Nishi, Kokubunji, all of Japan

[73] Assignee: Hitachi, Ltd., Tokyo, Japan

[*] Notice: This patent is subject to a terminal disclaimer.

[21] Appl. No.: 09/289,658

[22] Filed: Apr. 12, 1999

Related U.S. Application Data

[63] Continuation of application No. 08/952,344, filed as application No. PCT/JP96/01263, May 14, 1996, Pat. No. 5,893,746.

[30] Foreign Application Priority Data

May 18, 1995 [JP] Japan .................................. 7-120236

[51] Int. Cl.⁷ ............................. H01L 21/60; H01L 21/48
[52] U.S. Cl. ......................... 438/455; 438/15; 438/109; 438/156
[58] Field of Search ............................. 438/15, 156, 455

[56] References Cited

U.S. PATENT DOCUMENTS 5,656,552  8/1997  Hudak et al. ............................. 438/15

FOREIGN PATENT DOCUMENTS

| | | |
|---|---|---|
| 0510965 | 10/1992 | European Pat. Off. . |
| 4032397 | 4/1992 | Germany . |
| 62-37939 | 3/1987 | Japan . |
| 1-225509 | 9/1989 | Japan . |
| 4-30542 | 2/1992 | Japan . |
| 5-235094 | 9/1993 | Japan . |
| 6-105728 | 12/1994 | Japan . |

OTHER PUBLICATIONS

Patent Abstracts of Japan, Publication No. 05235094; Publication Date–Sep. 10, 1993.
Patent Abstracts of Japan, Publication No. 04030542; Publication Date–Feb. 3, 1992.

*Primary Examiner*—Charles Bowers
*Assistant Examiner*—David S Blum
*Attorney, Agent, or Firm*—Antonelli, Terry, Stout & Kraus, LLP

[57] ABSTRACT

A semiconductor chip (105') and a substrate (102) are bonded with an organic adhesive layer (409) containing conductive particles (406), and a pad (405) and an electrode (412) are mutually, electrically connected through the conductive particles (406).

The semiconductor chip (105') is formed by contacting a semiconductor wafer (105) attached to a tape (107) with an etchant while rotating the semiconductor wafer (105) within an in-plane direction at a high speed or reciprocating the wafer (105) laterally to uniformly etch the semiconductor wafer (105) thereby reducing the thickness thereof, and dicing the thus reduced wafer. The resultant thin chip (105') is hot-pressed by means of a heating head (106) for bonding on the substrate (102).

In this way, a thin semiconductor chip can be formed stably at low costs and bonded on a substrate without causing any crack of the chip, thereby obtaining a semiconductor device which is unlikely to break owing to the bending stress from outside.

31 Claims, 7 Drawing Sheets

101... frame, 103... adhesive, 104... dicing grooves,
105... wafer, 105'... chip, 106... heating head,
107... tape

501... nozzle for etchant, 502... etchant,
101... frame, 105... wafer, 107... tape

FIG. 6

101... frame, 103... adhesive, 104... dicing grooves,
105... wafer, 105'... chip, 106... heating head,
107... tape

FIG. 7

SEMICONDUCTOR DEVICE AND METHOD FOR MAKING SAME

This application is a Continuation application of Ser. No. 08/952,344, filed Nov. 18, 1997 now U.S. Pat. No. 5,893,746, the contents of which are incorporated herein by reference in their entirety, which is an application under 35 USC 371 of PCT/JP96/01263, filed May 14, 1996.

FIELD OF THE INVENTION

This invention relates to a semiconductor device and also to a method for making the same. More particularly, the invention relates to a semiconductor device which is very thin, is unlikely to break by bending stress, and is suitable for use as various types of cards, and also to a method for making such a thin semiconductor device stably and at low costs.

BACKGROUND ART

The formation of various types of cards such as IC cards has been proposed by utilizing a very thin semiconductor device. Hitherto, it has been difficult to obtain such cards which can stand use in practical applications owing to the ease in breakage by bending stress.

Conventional assembling technologies of thin semiconductor devices are described, for example, in "LSI Handbook" (edited by the Electronic Communication Society and published by Ohom Corporation on Nov. 30, 1984, pp. 406–416). In these conventional semiconductor device assembling technologies, there have been employed semiconductor wafers which have such a thickness of approximately 200 $\mu$m or over that they are very unlikely to break when direct handling is done.

As is well known in the art, a polishing method has been in wide use for thinning a semiconductor wafer. In order to uniformly process a semiconductor wafer, for example, with a process accuracy of 5% according to the polishing method, it is essential that the semiconductor wafer be set parallel to a polishing device at high accuracy and high reproducibility. For realizing such a very high level of parallel setting, a very expensive apparatus is necessary, thus having involved a difficulty in practical applications.

An attempt has been made to effect a polishing method while monitoring the thickness of a semiconductor wafer. If a region with a large area is polished according to this method, it takes a very long time, resulting in the lowering of productivity.

Alternatively, when a semiconductor wafer is polished to a very small thickness, for example, of approximately 0.1 $\mu$m, there arises the problem that various types of semiconductor devices, such as transistors, formed on the surface of the semiconductor wafer are broken owing to the stress caused by the polishing.

Moreover, when such a thinned semiconductor chip is directly handled according to the prior art technologies, a problem is involved in that the semiconductor chip is broken. Thus, it has been difficult to form a semiconductor device in high yield at low costs.

DISCLOSURE OF THE INVENTION

Accordingly, an object of the invention is to provide semiconductor device which can solve the problems of the prior art technologies, is unlikely to break owing to the ending stress exerted thereon, and can be utilized as various types of cards.

Another object of the invention is to provide a method or making a semiconductor device which is able to thin a semiconductor chip to a level of approximately 0.1 to 110 $\mu$m and wherein such a very thin chip can be handled without involving any cracking occasion.

In order to achieve the above objects, there is provided a semiconductor device which comprises a thin semiconductor chip and a substrate which are faced to each other via an organic adhesive layer containing a multitude of conductive particles therein, a pad made of a conductive film and formed on the surface at the substrate side of the semiconductor chip, and a substrate electrode provided on the surface at the chip side of the substrate such that the pad and the substrate electrode are electrically connected to each other via the conductive particles.

The thin semiconductor chip and the substrate made of an elastic material, which are arranged in face-to-face relation with each other, are bonded and fixed together through the organic adhesive layer, so that when exerted with a bending stress from outside, they are very unlikely to break.

The electric connection between the semiconductor chip and the substrate is ensured by means of the conductive particles present in the organic adhesive. The conductive particles are deformed by application of a pressure to the pad of the semiconductor chip and the electrode of the substrate which are arranged in face-to-face relation with each other. The thus deformed conductive particles serve to electrically connect the semiconductor chip and the substrate with each other, and thus, the electric connection between the pad and the electrode is very reliable.

A passivation film having a given pattern is formed on the semiconductor chip, and the pad is formed on a portion where no passivation film has been formed. The thickness of the pad is smaller than that of the passivation film, so that the conductive particles present between the pad and the electrode being faced to each other are effectively suppressed from migration to outside. In this way, the pad and the electrode can be reliably, electrically connected by means of the conductive particles.

A method for making a semiconductor device for the purpose of achieving the another object of the invention comprises bringing a semiconductor wafer, which has been attached to a tape, into contact with an etchant while rotating the wafer within an in-plane direction thereof or laterally reciprocating the wafer at a high speed so that the semiconductor wafer is uniformly reduced in thickness by etching, dicing the thus reduced semiconductor wafer for division into a plurality of chips, and subjecting individual thin chips to hot-pressing against a substrate to bond them on the substrate one by one.

While rotating the wafer in an in-plane direction thereof or laterally reciprocating it at a high speed, the semiconductor wafer is brought into contact with an etchant, so that the wafer is very uniformly etched. Thus, there can be obtained a very thin semiconductor wafer (0.1 to 110 $\mu$m) which is substantially free of any irregularities and distortion.

A plurality of the thin semiconductor chips which are obtained by dividing the very thin semiconductor wafer into smaller-sized chips are, respectively, separated from the tape which is a first substrate, and are heated on a second substrate and welded by compression pressure. Thus, irrespective of the semiconductor chips being very thin, the chips can be fixedly adhered or bonded on the second substrate without involving any undesirable cracking occasion. Especially, when a non-rigid tape is used as the first substrate, only a desired chip is pushed upwardly and is selectively heated, so that it is very easy to adhere the desired chip on the second substrate. For the division of the wafer into the chips, it is preferred from the standpoint of practical applications that the wafer is completely separated into individual chips by dicing.

The adhesion between the second substrate and the semiconductor chip is effected through a conductive adhesive, by which any wire bonding becomes unnecessary, thus being very effective in the simplification of the steps and the reduction of costs.

BRIEF ILLUSTRATION OF THE DRAWINGS

FIG. 4(1) is a plan view showing the connection between a chip and a substrate;

FIG. 4(2) is a sectional view showing the connection between the chip and the substrate;

FIG. 4(3) is a sectional view showing a connection portion between the chip and the substrate;

FIGS. 5(1) to 5(3) are, respectively, schematic views illustrating the steps of a second embodiment of the invention;

FIGS. 6(1) to 6(5) are, respectively, schematic views illustrating the steps of a third embodiment of the invention; and FIGS. 7(1) to 7(6) are, respectively, schematic views illustrating the steps of a fourth embodiment of the invention.

BEST MODE FOR CARRYING OUT THE INVENTION

Example 1

Figure 1:
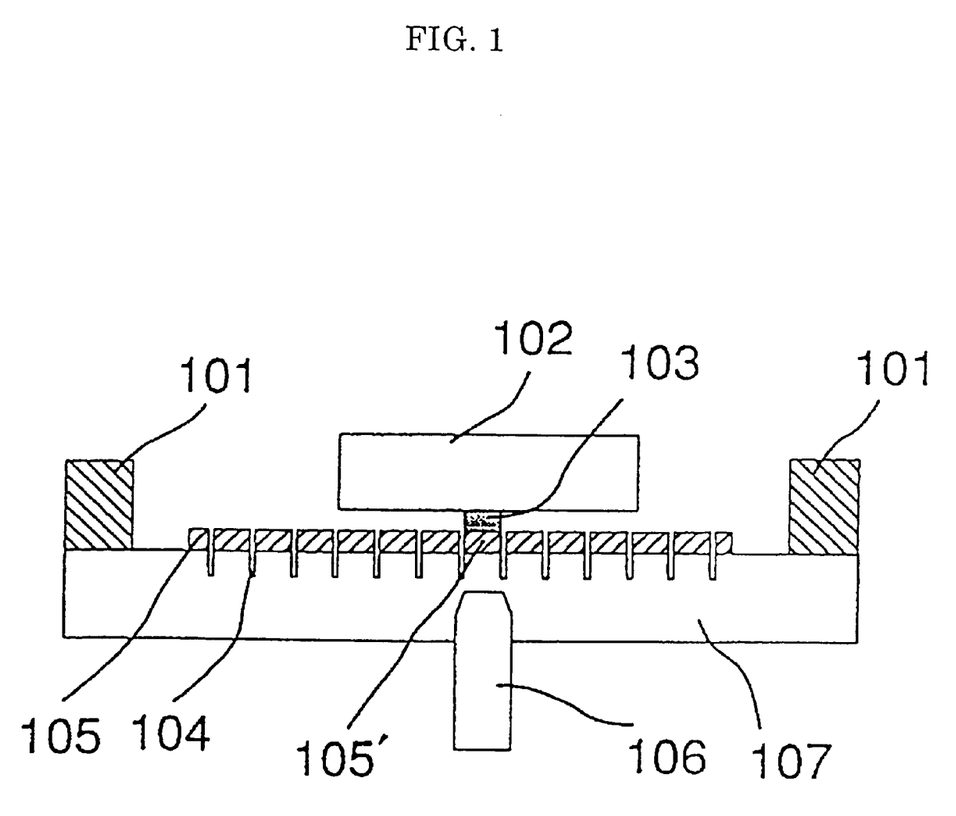
FIG. 1 is a view illustrating a first embodiment of the invention.

As shown in FIG. 1, a thin semiconductor wafer 105 is placed on a tape 107 (HA-1506 of Hitachi Chemical Ltd.) held with a frame 101. This semiconductor wafer 105 is completely cut off by means of dicing grooves 104 and separated into a plurality of chips 105'.

The separated chips 105' are pushed upwardly from the back side of the tape 107 by means of a heating head 106, and is urged against a substrate 102 on which an adhesive 103 has been preliminarily applied, thereby causing the chip to be thermally bonded to the substrate 102. The adhesive 103 is an anisotropic conductive adhesive made of a compound material of an organic material and conductive particles, so that an electrode (not shown) formed on the substrate 102 and an electrode (i.e. a pad, not shown) of the thin chip 105 are electrically connected with each other through the conductive particles contained in the adhesive 103 by application of a compression pressure and heat.

It will be noted that the chip 105' is so thin as approximately 0.1 to 110 $\mu$m in thickness and is bendable. If the thickness is smaller than 0.1 $\mu$m, a difficulty is involved in the formation of various types of semiconductor devices on the chip 105'. If the thickness is larger than 110 $\mu$m, cracking may occur on bending of the chip. The thickness of the chip 105' should be preferably within a range of 0.1 to 110 $\mu$m.

The tape 107 is non-rigid in nature. When the tape 107 is pushed upwardly while heating the tape 107 with the heating head 106, the thin chip 105' on the tape 107 is also pushed upwardly, thereby ensuring uniform and stable bonding with the substrate 102 placed above.

Figure 3:
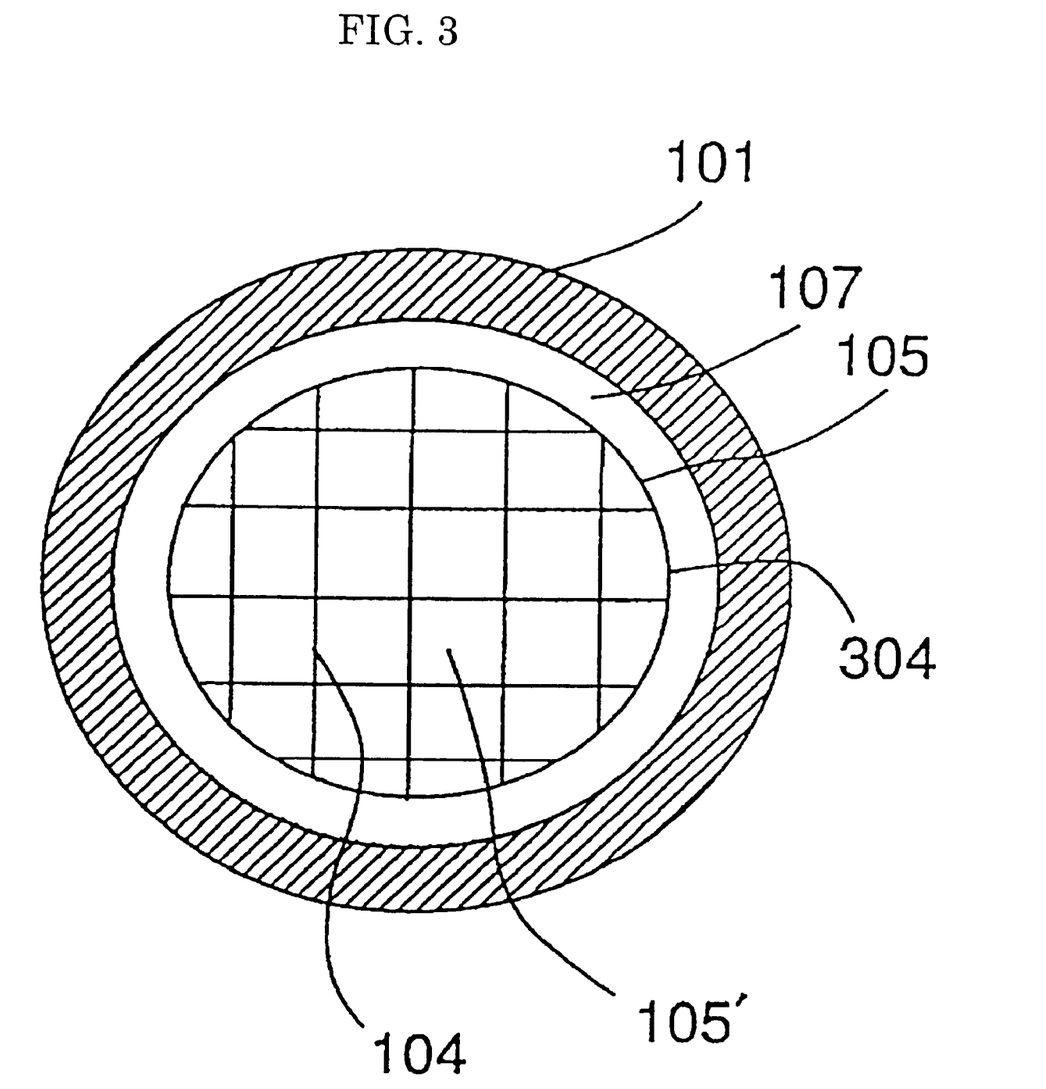
FIG. 3 is a plan view illustrating an embodiment of the invention.
Figure 4:
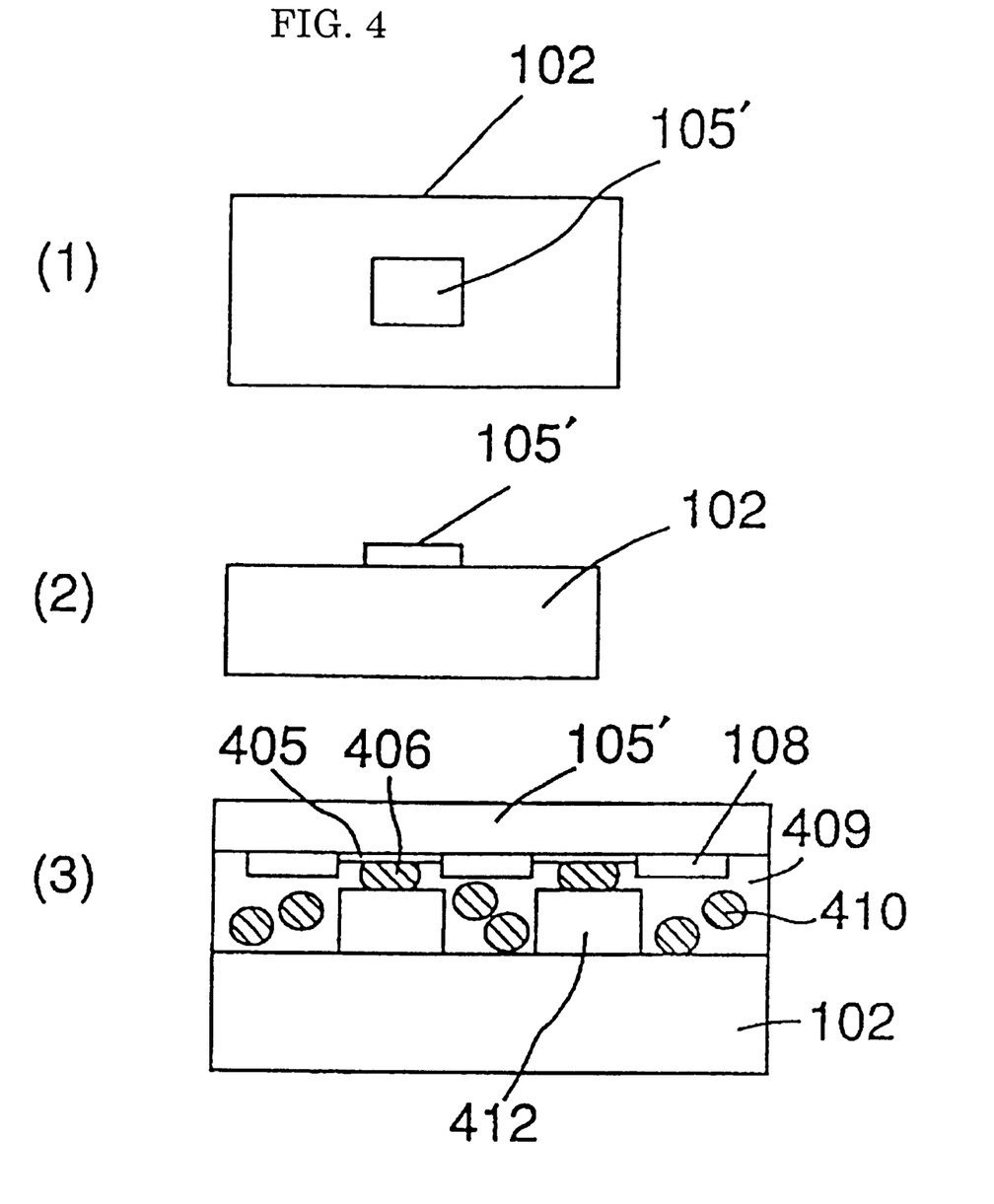
Figure 5:
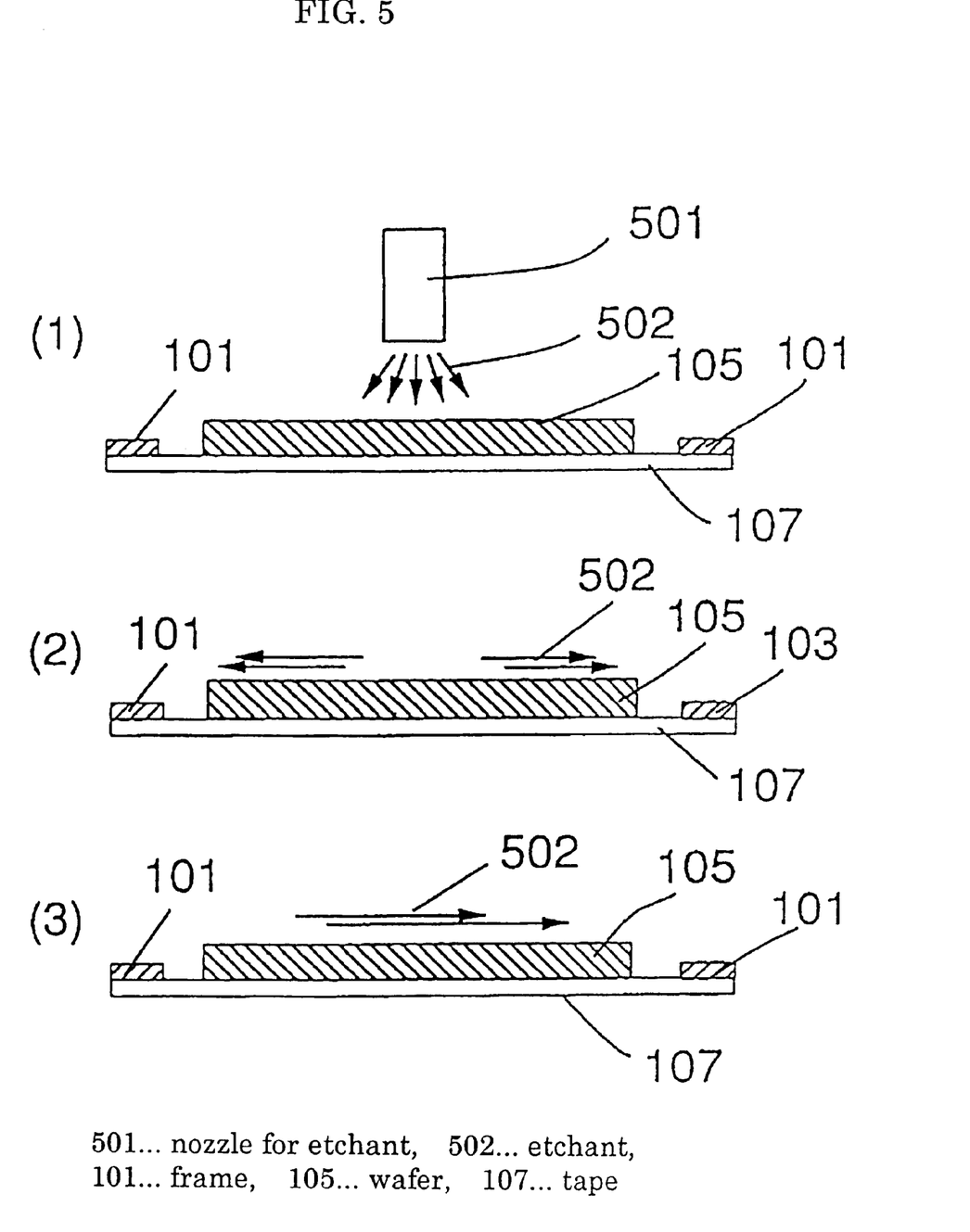
Figure 6:
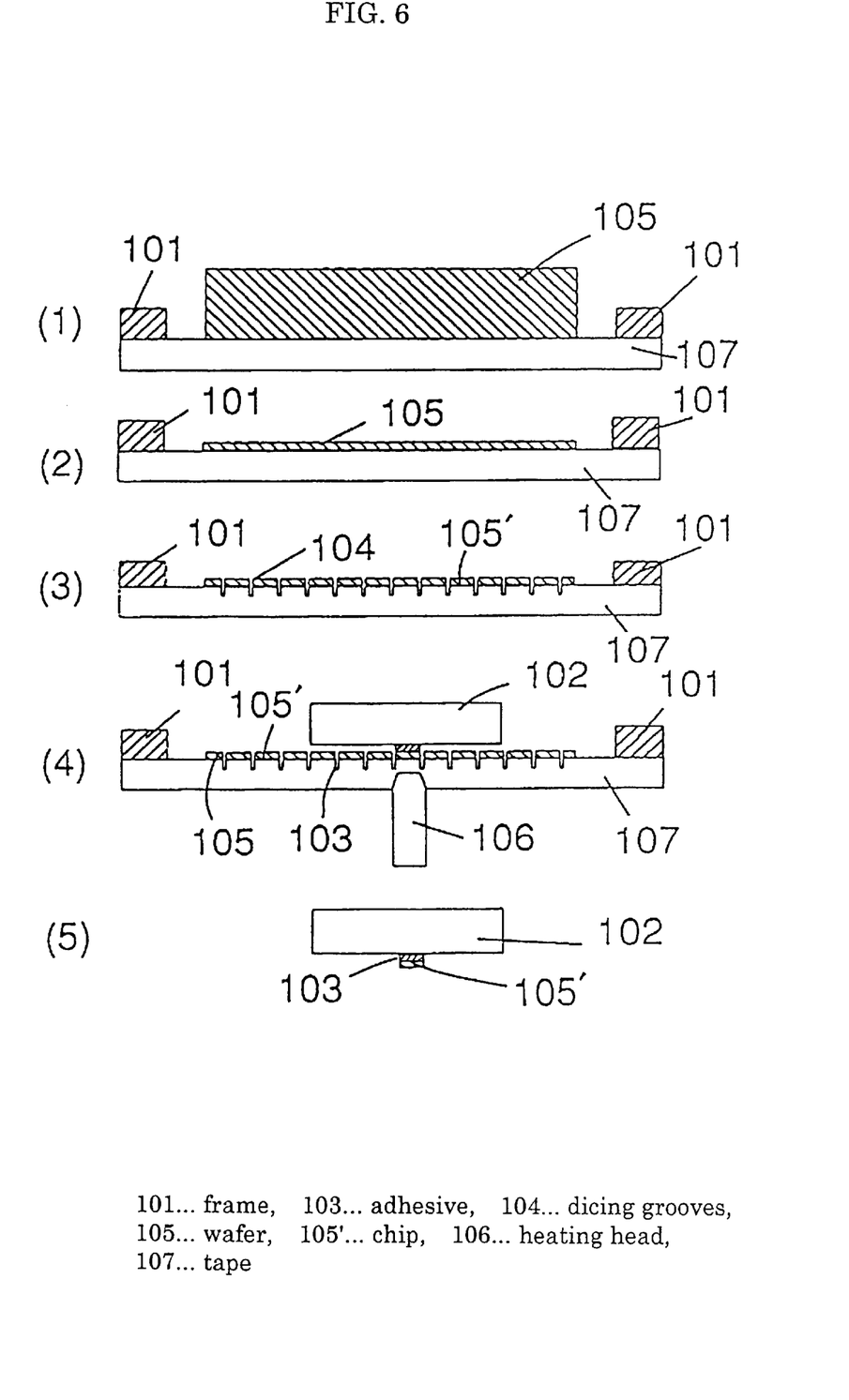
Figure 7:
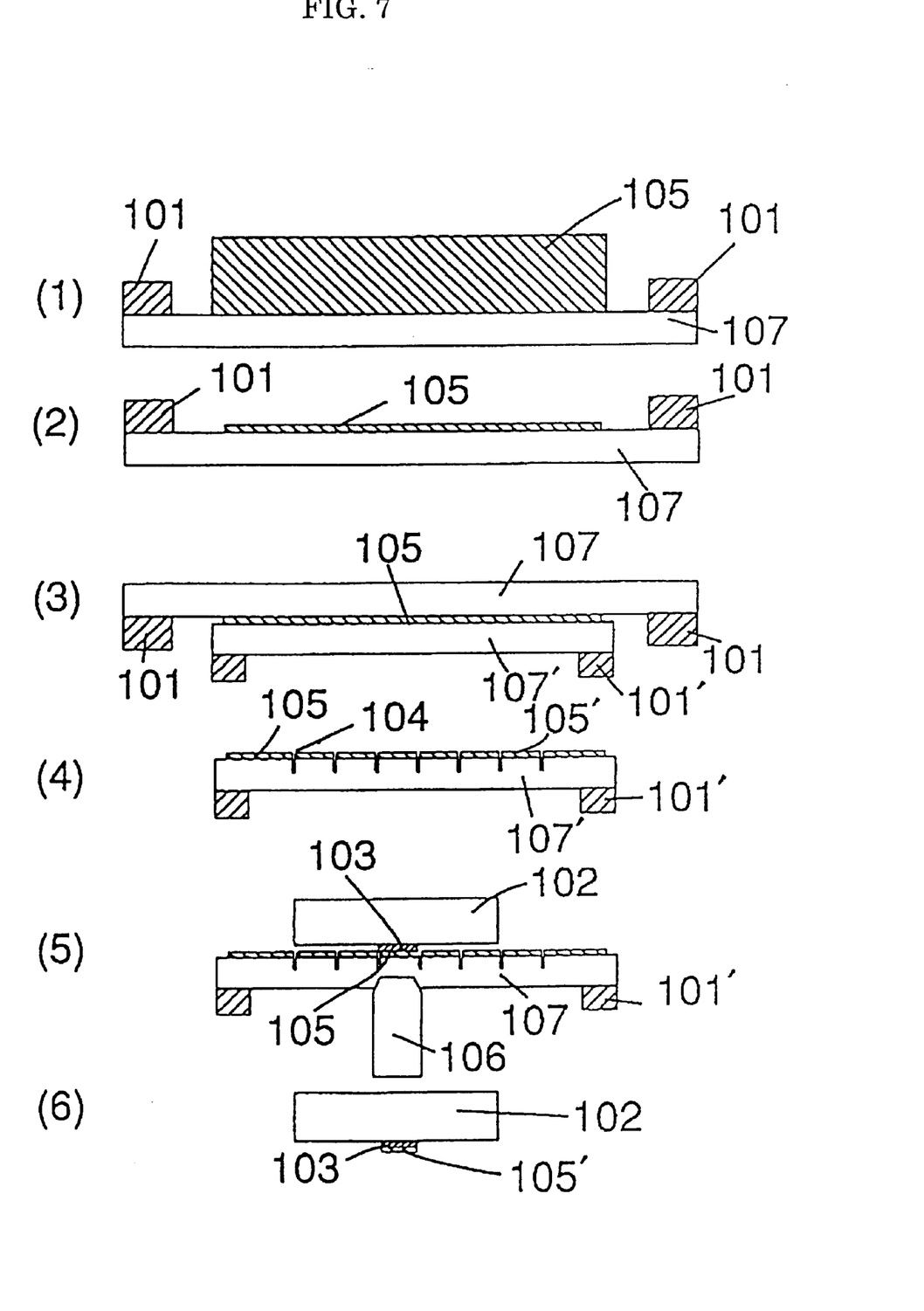

FIG. 3 is a view showing a plane structure of FIG. 1 wherein the tape 107 is held with a ring-shaped frame 101 and the wafer 105 is separated into a plurality of the chips 105' by the dicing grooves 104. A periphery 304 of the wafer 105 is within the inner side of the frame 101 and is adhered to the tape 107 as flattened. The frame 101 is formed of a stainless steel or a plastic material. Although the wafer 105 is very thin as having a thickness of from 0.1 to 110 $\mu$m, it is strongly adhered to the tape 107 by means of a pressure sensitive adhesive. In this condition, when the wafer 105 is diced under conditions where it is adhered to the tape 107, the resultant thin chips 105' do not individually peel off from the tape 107.

FIG. 4 shows the state observed after the thin chip 105' has been bonded to the substrate 102. FIG. 4(1) is a plan view and FIG. 4(2) is a sectional view. The thin chip 105' is bonded to a given position of the substrate 102. An electrode (pad) formed on the thin chip 105' and an electrode (substrate electrode) formed on the substrate 102 are mutually connected through face down bonding. Alternatively, they may be mutually connected with wire bonding or a conductive paste.

The mounting of the thin chips may be simply, easily realized as set out above, so that the thinning of, the impartment of high functionality to and low costs of semiconductor devices can be facilitated, thus enabling one to extend the ranges of application in many and new fields.

It will be noted that FIG. 4(3) is an enlarged, schematic sectional view showing a portion of connection between the thin chip 105' and the substrate 102 shown in FIG. 4(1) and 4(2). As shown in FIG. 4(3), the pad (i.e. an electrode provided on the semiconductor chip) 405 made of a conductive film is formed on a surface portion of the thin chip 105' which is free of any passivation film 108, and is connected with the substrate electrode 412 formed on the surface of the substrate 102 by means of the conductive particles 406. An organic film (an organic adhesive film) 409 is provided between the substrate 102 and the chip 105'. The conductive particles 410 are contained in the organic film 409 and ensures electric conduction between the pad 405 and the substrate electrode 412 therewith. In this case, as shown in FIG. 4(3), the thickness of the passivation film 108 is larger than that of the pad 405. This effectively suppresses the migration, to outside, of the conductive particles 406 intervening between the pad 405 and the substrate electrode 412. As a consequence, the pad 405 and the substrate electrode 412 are very reliably, electrically connected with each other.

Figure 2:
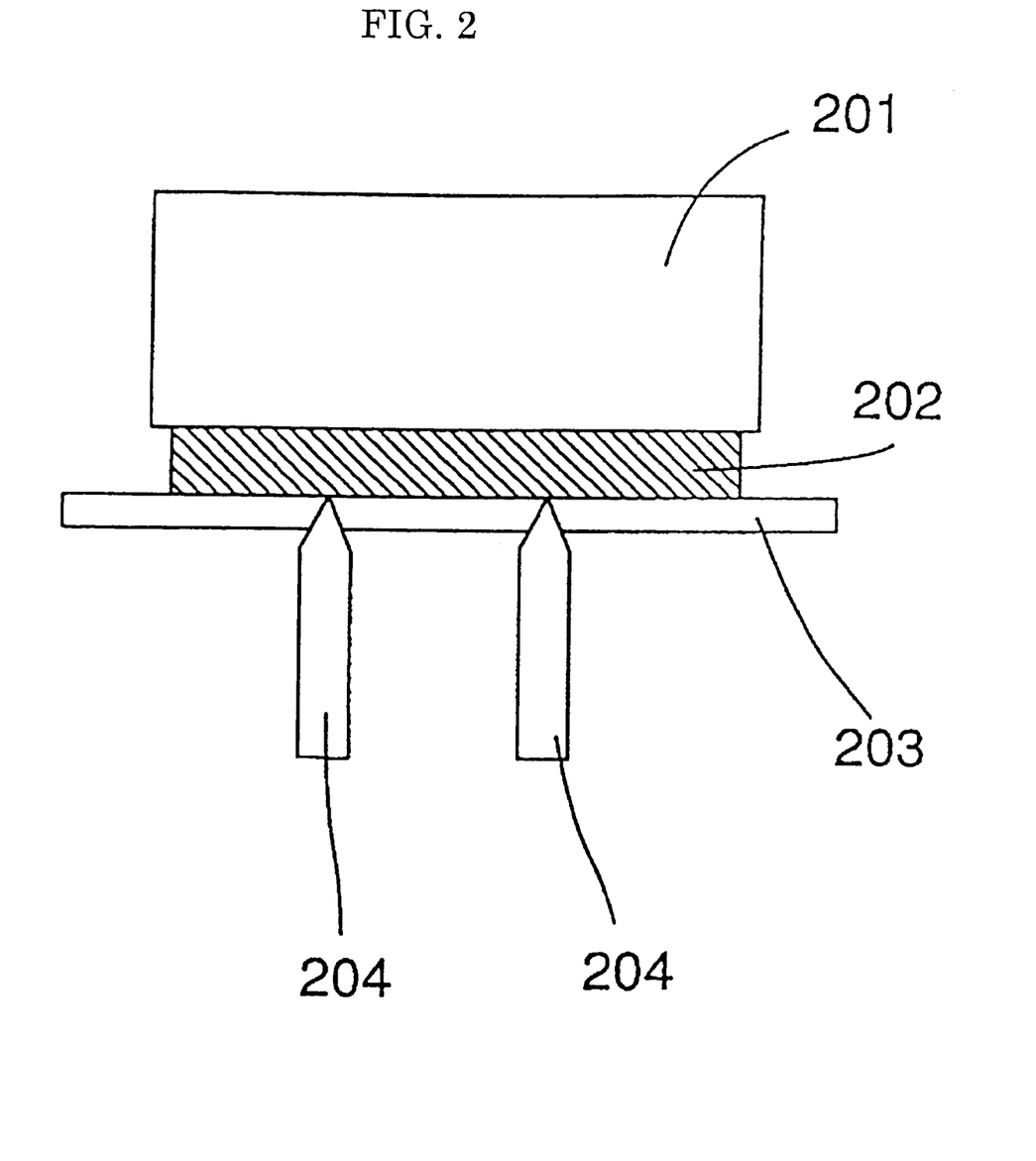
FIG. 2 is a view illustrating a prior art method.

In a prior art method, as shown in FIG. 2, a chip 202 placed on a tape 203 is handled with a vacuum chuck 201 and moved on other substrate (not shown). More particularly, the chip 202 placed on the tape 203 is one which is individually formed by dicing of a wafer. The chips 202 stuck up with a stick-up pin 204 are sucked by means of the vacuum chuck 201 and moved one by one.

The tape 203 is applied with a pressure sensitive adhesive, which lowers in adhesion properties by irradiation of Ultraviolet (UV) light or by application of heat, but slight adhesiveness is still left. Accordingly, the chip 202 can be separated from the tape 203 by means of the stick-up pin 204 operated in synchronism with the vacuum chuck 201.

However, in the known method of sticking up the chip with the stick-up pin 204, when the chip 202 is very thin with its thickness being 0.1 to 110 μm, the chip 202 is apt to crack. Thus, productivity lowers, making it difficult to widely use the method in practical applications.

Example 2

This example illustrates a method of thinning a semiconductor wafer.

As shown in FIG. 5(1), a Si wafer 105 is fixed, by means of a pressure sensitive adhesive, on a tape 107 attached to a frame 101, after which while the Si wafer 105 is rotated at a high speed of 1,000 r.p.m. or over, an etchant 502 is dropped from an etching nozzle 501 on the Si wafer 105, thereby etching the surface of the Si wafer 105. The etchant 502 used in this example consists of an aqueous solution of potassium hydroxide (concentration: 40%). Etchants other than that of potassium hydroxide may also be used.

Since the etchant 502 is dropped while rotating the Si wafer 105 at a high speed, the etchant 502 dropped on the surface of the Si wafer 105 moves laterally relative to the surface of the Si wafer 105 at a high speed as shown in FIG. 5(2). This causes the surface of the Si wafer 105 to be uniformly etched, enabling one to make the Si wafer 105 thin without involving any difference in level or any damage.

As shown in FIG. 5(3), when the etchant 502 is dropped while rotating at a high speed of 1,000 r.p.m. or over, the etchant 502 likewise moves at a high speed laterally along the surface of the Si wafer 105. Thus, the surface of the Si wafer 105 is uniformly etched without producing any difference in level or any damage, and can thus be thinned.

Example 3

FIG. 6 is a process chart showing a further embodiment of the invention.

As shown in FIG. 6(1), a Si wafer 105 is fixed on a tape 107 attached to a frame 101, after which the Si wafer 105 is etched and thinned according to the method illustrated in Example 2, thereby forming a sectional structure shown in FIG. 6(2). Further, as shown in FIG. 6(3), the Si wafer 105 is formed with dicing grooves 104 to divide the Si wafer 105 into a plurality of chips 105'.

Then, as shown in FIG. 6(4), a given chip 105' is placed in position of the substrate 102, followed by moving a heating head 106 from below and hot pressing the chip 105' against the substrate 102 to move the thin chip 105' on the substrate 102 as shown in FIG. 6(5), thereby bonding them together through an adhesive 103. The characteristic properties of each chip 105' have been preliminarily measured prior to the division in the form of a wafer, thereby individually confirming non-defective and defective chips. Accordingly, non-defective chips alone are selectively placed in position, and are moved and bonded on the substrate 102.

It will be noted that in Examples 2 and 3, the tape 107 used is the same type as of that used in Example 1, and other types of tapes may also be used.

Example 4

This example illustrates bonding of a thin chip and a substrate by face-down-bonding wherein the main surface of the chip and the main surface of the substrate are facing each other.

Initially, as shown in FIG. 7(1), a Si wafer 105 is fixed on a first tape 107 attached to a first frame 101 by means of a pressure sensitive tape. Thereafter, as shown in FIG. 7(2), the Si wafer is thinned in the same manner as in Example 2.

Next, as shown in FIG. 7(3), the surface of the Si wafer 105 is turned down and is placed in face-to-face relation with the surface of a second tape 107' attached to a second frame 101', thereby sticking them together.

The first tape 107 is released from the Si wafer 105 to obtain such a structure that the Si wafer 105 is formed on the surface of the second tape 107'. Subsequently, as shown in FIG. 7(4), dicing grooves 104 are formed in the Si wafer 105 to divide the wafer into a plurality of chips 105'.

As shown in FIG. 7(5), a given chip 105' is placed in position of the substrate 102, followed by moving a heating head 106 from below and hot-pressing to bond the thin chip 105' on the substrate 102 through an anisotropic conductive adhesive 103 as shown in FIG. 7(6).

According to this example, the chip 105' is moved on the substrate 102 after the movement on the second tape 107'. This changes up and bottom sides when compared with the case of Example 1. More particularly, the initial upper surface of Si wafer 105 is kept up after having been bonded to the substrate 102. Accordingly, in this example, if a desired semiconductor device is formed on the surface of the Si wafer 105 after the Si wafer 105 has been made thin, the semiconductor device is arranged on the surface of the chip 105' which has been formed on the surface of the substrate 102.

As will be clear from the foregoing, the following effects and advantages can be expected according to the invention.

(1) A very thin semiconductor chip is bonded on a substrate by means of an adhesive, and a pad formed on the surface of the semiconductor chip and a substrate electrode formed on the surface of the substrate are mutually electrically connected through the conductive particles contained in the adhesive, thereby ensuring a reduced possibility of breakage due to the bending and high reliability on the electric connection.

(2) Since the semiconductor wafer is thinned by means of an etchant which moves along the main surface of the wafer at a high speed, a uniformly thin semiconductor can be readily obtained without involving any strain or defects therein.

(3) The release of a thin semiconductor chip from the tape and the bonding to a substrate are performed in the same step, so that the thin semiconductor chip can be bonded on the substrate without cracking.

(4) While a desired semiconductor chip is selectively heated and compressed, it is moved on the substrate, thereby ensuring mounting of the thin chip on the substrate very easily at low costs.

(5) Each semiconductor chip can be bonded on a substrate by means of an anisotropic conductive adhesive, so that the chip can be electrically connected with the substrate without wire bonding.

(6) The thickness of the semiconductor chip is so small as from 0.1 to 110 μm, within which the chip is able to bend, thus making it possible to realize a bend-resistance, thin semiconductor device.

What is claimed is:

1. A method for fabricating a semiconductor device, comprising the steps of:

providing a semiconductor wafer, a thickness of said semiconductor wafer having been reduced by removing material of the semiconductor wafer from a rear surface thereof, to provide a semiconductor wafer having a reduced thickness, said semiconductor wafer having a plurality of semiconductor elements on a surface thereof, a surface of the semiconductor wafer being covered by a first substrate;

covering said rear surface of said semiconductor wafer having a reduced thickness with a second substrate;

removing said first substrate from said semiconductor wafer having said second substrate;

dividing said semiconductor wafer into plural chips having semiconductor elements thereon, by cutting completely through said semiconductor wafer; and fixing a chip, of the plural chips, to a third substrate facing to a surface of the chip on which a semiconductor element is disposed.

2. A method for fabricating a semiconductor device according to claim 1, wherein said first substrate is a tape.

3. A method for fabricating a semiconductor device according to claim 2, wherein said tape is a tape containing an organic material.

4. A method for fabricating a semiconductor device according to claim 3, wherein said tape is supported by a frame.

5. A method for fabricating a semiconductor device according to claim 4, wherein said frame is a ring-shaped frame.

6. A method for fabricating a semiconductor device according to claim 1, wherein said step of fixing said chip to said third substrate is carried out by heating said chip selectively and pushing it out to said third substrate.

7. A method for fabricating a semiconductor device according to claim 1, wherein said step of fixing said chip to said third substrate is carried out by pressing upon and heating said chip by using a heating head disposed under said first substrate.

8. A method for fabricating a semiconductor device according to claim 1, wherein said chip is fixed to said third substrate with an adhesive layer formed on a surface of said third substrate.

9. A method for fabricating a semiconductor device according to claim 8, wherein said adhesive layer is an anisotropic electroconductive adhesive layer.

10. A method for fabricating a semiconductor device according to claim 9, wherein said anisotropic electroconductive adhesive layer contains organic material and conductive particles.

11. A method for fabricating a semiconductor device according to claim 1, wherein an electrode, formed on the surface of said chip, is electrically connected with an electrode formed on a surface of said third substrate by means of a face-down bonding.

12. A method for fabricating a semiconductor device according to claim 1, wherein said third substrate is a tape.

13. A method for fabricating a semiconductor device according to claim 1, wherein the reduced thickness of said semiconductor wafer is a thickness of 0.1 $\mu$m–110 $\mu$m.

14. A method for fabricating a semiconductor device according to claim 1, wherein a step of forming a passivation film having a first shape on the chip and a step of forming an electrode, having a thickness smaller than that of said passivation film, on the chip are carried cut before said step of fixing said chip to said third substrate.

15. A method for fabricating a semiconductor device according to claim 14, wherein said electrode is formed on a surface of the chip facing to said third substrate, and is not formed at locations where the passivation film is formed.

16. A method for fabricating a semiconductor device according to claim 1, wherein the semiconductor wafer has a first surface opposite the rear surface, and wherein the plurality of semiconductor elements are on said first surface of the semiconductor wafer, said first surface being the surface covered by the first substrate.

17. A method for fabricating a semiconductor device, comprising the steps of:

providing a first substrate, having a plurality of semiconductor elements on a first main surface thereof, said first substrate having a thickness which has been reduced by removing material of the first substrate from a second main surface thereof opposite the first main surface, to provide a first substrate with a reduced thickness of 0.1 $\mu$m to 110 $\mu$m, the first main surface being covered by a first tape;

covering said second main surface of said first substrate, having a reduced thickness, with a second tape;

removing said first tape from said first substrate having said second tape;

dividing said first substrate having a reduced thickness into plural chips;

facing said first main surface to wiring formed on a second substrate; and heating and fixing a chip, of said plural chips, to said second substrate such that outer terminals of semiconductor elements formed on said chip are electrically connected with said wiring formed on said second substrate through an anisotropic conductive adhesion layer.

18. A method for fabricating a semiconductor device according to claim 17, wherein said step of dividing said first substrate having a reduced thickness into plural chips is carried out by completely cutting through said first substrate.

19. A method for fabricating a semiconductor device according to claim 17, wherein said first tape is supported by a frame.

20. A method for fabricating a semiconductor device, comprising the steps of:

providing a first substrate, a thickness of the first substrate having been reduced to 0.1 $\mu$m–110 $\mu$m by removing material of the first substrate from a rear surface thereof, said first substrate having a plurality of semiconductor elements on a surface thereof, a surface of said first substrate being covered by a first film;

covering said rear surface of said first substrate having a reduced thickness with a second film;

removing said first film from said first substrate having said second film;

dividing said first substrate into plural semiconductor chips by cutting said first substrate;

facing a second substrate to the surface of said first substrate on which said semiconductor elements are formed; and pushing a semiconductor chip, of the plural semiconductor chips, by a heating head in the direction from said second film to said second substrate such that said semiconductor chip is detached from said second film.

21. A method for fabricating a semiconductor device according to claim 20, wherein said step of dividing said first substrate into plural semiconductor chips is carried out by completely cutting through said first substrate.

22. A method for fabricating a semiconductor device according to claim 20, wherein said chip is fixed to said second substrate by using an anisotropic electroconductive adhesive.

23. A method for fabricating a semiconductor device according to claim 20, wherein the first substrate has a first surface opposite the rear surface, and wherein the plurality of semiconductor elements are on the first surface of the first substrate, said first surface being the surface covered by said first film.

24. A method for fabricating a semiconductor device, comprising the steps of:

provyling a first substrate, having a thickness which has been reduced to 0.1 μm to 110 μm by removing material of the first substrate from a rear surface thereof, said first substrate having a plurality of semiconductor elements on a surface thereof, a surface of the first substrate being covered by a first tape;

covering said rear surface of said first substrate having a reduced thickness with a second tape;

removing said first tape from said first substrate having said second tape;

dividing said first substrate into plural semiconductor chips having a reduced thickness by cutting said first substrate;

disposing a second substrate so as to face to said first substrate; and pushing out a semiconductor chip, of the plural semiconductor chips, from a back side of said second tape, to said second substrate, by a heating head so as to fix said semiconductor chip to said second substrate.

25. A method for fabricating a semiconductor device according to claim 24, wherein said semiconductor chip is fixed to said second substrate by using an anisotropic electroconductive adhesive.

26. A method for fabricating a semiconductor device according to claim 24, wherein the first substrate has a first surface opposite the rear surface, and wherein the plurality of semiconductor elements are on the first surface of the first substrate, said first surface being the surface covered by said first tape.

27. A method for fabricating a semiconductor device, comprising the steps of:

providing a semiconductor wafer, whose thickness has been reduced to 0.1 μm to 110 μm by removing material of the semiconductor wafer from a rear surface thereof, said semiconductor wafer having a plurality of semiconductor elements on a surface thereof, a surface of said semiconductor wafer being covered by a first film;

covering said rear surface of said semiconductor wafer having a reduced thickness with a second film;

removing said first film from said semiconductor wafer having said second film;

dividing the semiconductor wafer having a reduced thickness into plural semiconductor chips by completely cutting through said semiconductor wafer; and fixing a semiconductor chip, of the plural semiconductor chips, to a substrate.

28. A method for fabricating a semiconductor device according to claim 27, wherein the semiconductor wafer has a first surface opposite the rear surface, and wherein the plurality of semiconductor elements are on said first surface of the semiconductor wafer, said first surface being the surface covered by the first film.

29. A method for fabricating a semiconductor device, comprising the steps of:

providing a semiconductor substrate having a thickness which has been reduced to 0.1 μm to 110 μm by removing material of the semiconductor substrate from a rear surface thereof, said semiconductor substrate having a plurality of semiconductor elements on a surface thereof, a surface of said semiconductor substrate being covered by a first film;

covering said rear surface of said semiconductor substrate having a reduced thickness with a second film;

removing said first film from said semiconductor substrate having said second film;

dividing said semiconductor substrate having a reduced thickness into plural semiconductor chips by completely cutting through the semiconductor substrate having the reduced thickness; and detaching a semiconductor chip, of the plural semiconductor chips, from said second film by pushing out said semiconductor chip from a back side of said second film by using a head having a flat surface.

30. A method for fabricating a semiconductor device according to claim 29, wherein the semiconductor substrate has a first surface opposite the rear surface, and wherein the plurality of semiconductor elements are on said first surface of the semiconductor substrate, said first surface being the surface covered by said first film.

31. A method for fabricating a semiconductor device, comprising the steps of:

providing a first substrate whose thickness has been reduced to 0.1 μm to 110 μm by removing material of the first substrate from a second main surface thereof, said first substrate having a plurality of semiconductor elements on a first surface thereof opposite to the second main surface, said first surface being covered by a first film;

covering said second main surface of said first substrate having a reduced thickness with a second film;

removing said first film formed from said first substrate having said second film;

cutting completely said first substrate having a reduced thickness so as to divide said first substrate into plural chips; and detaching a chip of said plural chips from said second film by pushing out said chip from a back side of said second film by using a head having a flat surface.

* * * * *